US009253891B2

(12) United States Patent
Williams

(10) Patent No.: US 9,253,891 B2
(45) Date of Patent: Feb. 2, 2016

(54) BED MONITORING PAD
(71) Applicant: Rondish Co., LTD., Kwai Chung, N.T. (CN)
(72) Inventor: Steven Alfred Williams, Lantau Island (CN)
(73) Assignee: Rondish Co., LTD., Kwai Chung, N.T. (HK)
( * ) Notice: Subject to any disclaimer, the term of this patent is extended or adjusted under 35 U.S.C. 154(b) by 116 days.
(21) Appl. No.: 14/075,133
(22) Filed: Nov. 8, 2013
(65) Prior Publication Data
US 2014/0125486 A1  May 8, 2014

Related U.S. Application Data
(60) Provisional application No. 61/723,940, filed on Nov. 8, 2012.

(51) Int. Cl.
G08B 23/00 (2006.01)
H05K 3/10 (2006.01)
G08B 21/04 (2006.01)
(52) U.S. Cl.
CPC .............. H05K 3/10 (2013.01); G08B 21/0461 (2013.01); Y10T 29/49155 (2015.01)
(58) Field of Classification Search
CPC ........... G08B 21/22; A61B 2562/0247; A61B 5/02233; A61B 5/0408; A61B 5/1115; A61B 5/1116; A61B 5/145; A61B 5/6892; A61K 31/41; A61K 31/4535; A61K 31/55; A61K 31/551; G01G 19/44; G01G 19/445
USPC ...................... 340/573.1, 573.3, 573.4, 573.5
See application file for complete search history.

(56) References Cited

U.S. PATENT DOCUMENTS 3,533,095 A * 10/1970 Collins ................ A61D 17/008
119/28.5
4,539,560 A * 9/1985 Fleck .................... A61B 5/1115
177/144
4,646,001 A * 2/1987 Baldwin ................. B04C 11/00
188/1.11 L
4,845,323 A * 7/1989 Beggs .................... H01H 3/142
200/5 A
4,884,434 A * 12/1989 Satake .................. F16D 66/027
250/227.14
4,947,152 A  8/1990 Hodges
5,184,112 A * 2/1993 Gusakov .............. A61B 5/1115
340/573.1
5,276,432 A * 1/1994 Travis .................. A61B 5/1115
177/144
5,353,012 A * 10/1994 Barham ................. H01H 3/142
200/85 R
5,796,059 A * 8/1998 Boon .................... A61B 5/1115
200/85 R
5,844,488 A * 12/1998 Musick .................... G08B 21/22
340/286.07
5,844,884 A * 12/1998 Szlenski ............... G01R 31/362
320/149
6,049,281 A  4/2000 Osterweil
6,067,019 A * 5/2000 Scott ........................ A61B 5/11
340/562

(Continued)

FOREIGN PATENT DOCUMENTS

CN  1835710 A  9/2006
CN  1897871 A  1/2007

(Continued)

Primary Examiner — Paul Obiniyi
(74) Attorney, Agent, or Firm — Fred C. Hernandez; Mintz Levin Cohn Ferris Glovsky and Popeo, P.C.

(57) ABSTRACT

A sensor pad that is adapted to be positioned on a patient's bed or chair as part of a monitoring system that provides a signal to a caregiver when the patient rises from the bed or chair also indicates when the pad is near failure. The sensor pad includes specialized contact plate patterning that creates zones on the sensor pad.

7 Claims, 5 Drawing Sheets

(56) References Cited

U.S. PATENT DOCUMENTS

| | | | |
|---|---|---|---|
| 6,076,389 A * | 6/2000 | Kaneko | F02D 41/1495 73/1.06 |
| 6,133,837 A * | 10/2000 | Riley | A61B 5/1115 340/524 |
| 6,204,767 B1 * | 3/2001 | Sparks | G08B 21/0446 340/573.1 |
| 6,778,090 B2 * | 8/2004 | Newham | A61B 5/1115 340/562 |
| 7,474,224 B2 | 1/2009 | Long et al. | |
| 7,656,299 B2 * | 2/2010 | Gentry | A61B 5/1113 340/562 |
| 7,924,163 B1 * | 4/2011 | Long | A61B 5/1117 340/573.1 |
| 7,987,069 B2 * | 7/2011 | Rodgers | A61B 5/1115 340/573.1 |
| 8,375,522 B2 | 2/2013 | York et al. | |
| 8,419,660 B1 * | 4/2013 | Shaw | A47C 31/123 600/587 |
| 2002/0124295 A1 * | 9/2002 | Fenwick | A41D 13/1245 2/69 |
| 2003/0011479 A1 * | 1/2003 | Bluteau | A61F 13/42 340/573.5 |
| 2004/0046668 A1 | 3/2004 | Smith et al. | |
| 2004/0112528 A1 * | 6/2004 | Karandikar | B29C 65/18 156/306.6 |
| 2005/0110617 A1 | 5/2005 | Kile et al. | |
| 2005/0200488 A1 | 9/2005 | Riley et al. | |
| 2006/0055526 A1 * | 3/2006 | Long | G08B 21/22 340/502 |
| 2007/0132558 A1 | 6/2007 | Rowe et al. | |
| 2008/0077027 A1 | 3/2008 | Allgeyer | |
| 2009/0289800 A1 * | 11/2009 | Hansen | A61B 5/1115 340/573.1 |
| 2010/0033331 A1 | 2/2010 | Bautovich | |
| 2010/0163315 A1 * | 7/2010 | York | G01G 19/44 177/144 |
| 2012/0025992 A1 | 2/2012 | Tallent et al. | |
| 2014/0145848 A1 * | 5/2014 | Amir | G08B 21/043 340/573.1 |
| 2014/0232556 A1 | 8/2014 | Williams | |
| 2015/0035671 A1 | 2/2015 | Williams | |
| 2015/0035677 A1 | 2/2015 | Williams | |
| 2015/0039794 A1 | 2/2015 | Williams | |

FOREIGN PATENT DOCUMENTS

| | | | |
|---|---|---|---|
| CN | 101496016 A | 7/2009 | |
| CN | 101833849 A | 9/2010 | |
| CN | 102354186 A | 2/2012 | |
| CN | 102665548 A | 9/2012 | |
| CN | 203070488 U | 7/2013 | |
| JP | 07239990 A * | 9/1995 | G08B 25/04 |
| JP | H105180 A | 1/1998 | |
| JP | 2010085263 A | 4/2010 | |
| WO | WO-2011/069069 A3 | 6/2011 | |
| WO | WO-2011/094267 A1 | 8/2011 | |

* cited by examiner

BED MONITORING PAD

CROSS-REFERENCE TO RELATED APPLICATIONS

This application claims priority under 35 U.S.C. §119(e) to U.S. Provisional Patent Application Ser. No. 61/723,940, titled "Bed Monitoring Pad," filed Nov. 8, 2012, the disclosure of which is hereby incorporated by reference in its entirety. The priority date of Nov. 8, 2012 is hereby claimed.

BACKGROUND

The present disclosure relates to a sensor pad, in particular, a pad for detecting when an individual exits a chair or a bed.

A serious problem encountered by operators of hospitals, nursing homes, retirement centers, and other facilities that care for patients with limited mobility is that patients who leave their beds without assistance may subsequently trip or fall. Patients that are heavily medicated or sedated are particularly susceptible to falls. For these reasons, much consideration has been given to systems for monitoring patients and providing a warning that a patient is rising from or has left his or her bed.

One type of patient monitoring system includes a sensor pad positionable on a mattress of a bed or seat of a chair. The sensor pad is communicatively coupled to a monitoring device, such as a nurse call system. When pressure on the sensor pad is removed, such as when the patient removes himself or herself from the bed or chair, the sensor pad sends a notification to the monitoring device which provides a notification to a caregiver that the patient is no longer in bed or seated in the chair.

Currently, most of the sensor pads used in patient beds wear out over time and must be replaced before the sensor pads completely fail. However, the ability to precisely predict the lifetime of sensor pads is elusive. Factors such as the frequency of use, the weight of the patient on the sensor pad, and the amount of movement of the patient are variables that affect the speed with which a sensor pad wears out. Failure due to wear or other factors, including dampness in the sensor pad, can cause the sensor pad to indicate that a patient is in bed or in a chair when the patient has in fact gotten up, and as a result, the caregiver is not aware of the patient's change in location.

SUMMARY

Disclosed is a patient monitoring system that includes a sensor pad that is capable of indicating when the sensor pad is near failure. This capability is due to the operation of the monitoring system and to the unique patterning of the contacts plates in the sensor pad. These features allow the patient monitoring system to detect abnormally high or low resistance across the sensor pad, indicating a fault state in the sensor pad. Also described is a sensor pad that is capable of giving an indication of partial failure of the sensor pad while still detecting the presence or absence of a patient on the sensor pad.

In some implementations, a bed monitoring pad is provided that includes a first flexible plate with conductive material and a second plate with conductive material in which the first flexible plate includes at least two zones of conductivity.

In a related aspect, some implementations describe a patient monitoring system that includes an alarm indicator and a bed monitoring pad that includes a first flexible plate with conductive material and a second plate with conductive material in which the first flexible plate includes at least two zones of conductivity.

Further, in another related aspect, some implementations provide a method of making a patient monitoring pad that includes fabricating a flexible plate, fabricating a second plate, placing the flexible plate opposite the second plate, and creating an electrical circuit between the flexible plate and the second plate. Fabricating the flexible plate can include fabricating conductive material on a first surface of the flexible plate, with the conductive material forming at least two patterns that are electrically connected to a first printed circuit board (PCB). Fabricating the second plate can include fabricating conductive material on a first surface of the second plate, with the conductive material forming a single pattern that is electrically connected to a second printed circuit board. Placing the flexible plate opposite the second plate can include placing the first surface of the flexible plate facing the first surface of the second plate, and also placing a compliant material between the flexible plate and the second plate. Creating an electrical circuit between the flexible plate and the second plate can create an electrical circuit that provides at least information about a resistance in the circuit between the flexible plate and the second plate when current flows through the circuit and is monitored.

The following features can be present in the above method in any reasonable combination. The resistance in the circuit between the flexible plate and the second plate can correlate to an amount of contact wear between the flexible plate and the second plate in some implementations. In implementations of the method above, the resistance between the flexible plate and the second plate can indicate a useful life-time remaining for the patient monitoring pad. The resistance between the flexible plate and the second plate can correlate to soiling or water ingress in that area of the patient monitoring pad in some implementations. In some implementations, the resistance between the flexible plate and the second plate can indicate a risk of non-operation of the patient monitoring pad.

Other features and advantages should be apparent from the following description of various embodiments, which illustrate, by way of example, the principles of the disclosure.

DETAILED DESCRIPTION

A patient monitoring system with a sensor pad for use with patient beds has the ability to indicate when the sensor pad is approaching the end of its useful life and is likely to no longer be reliable in indicating the movement of a patient out of bed. The patient monitoring system has the ability to operate in a configuration that allows the progression of the electrical resistance in the sensor pad to be monitored, and when the electrical resistance exceeds a predetermined, threshold value, the patient monitoring system indicates that the sensor pad has exceeded its useful lifetime. The increase in electrical resistance in a sensor pad over time occurs because of changes in the conductive material on the plate, and this increase in resistance may lead to false notifications of a patient leaving bed if left unchecked. The patient monitoring system can also account for the converse situation, that is to say when the sensor pad fails due to short-circuiting when the resistance between the top plate and bottom plate becomes below a preset value, even when a patient is not situated on the sensor pad. The sensor pad is configured with two or more zones on at least one plate, so when one zone is detected by the system to be in a continuous contact while the others are detected to have a resistance between the plates for an extended period of time, the system acknowledges that the sensor pad is in a fail state and alerts the caregiver.

Figure 1A:
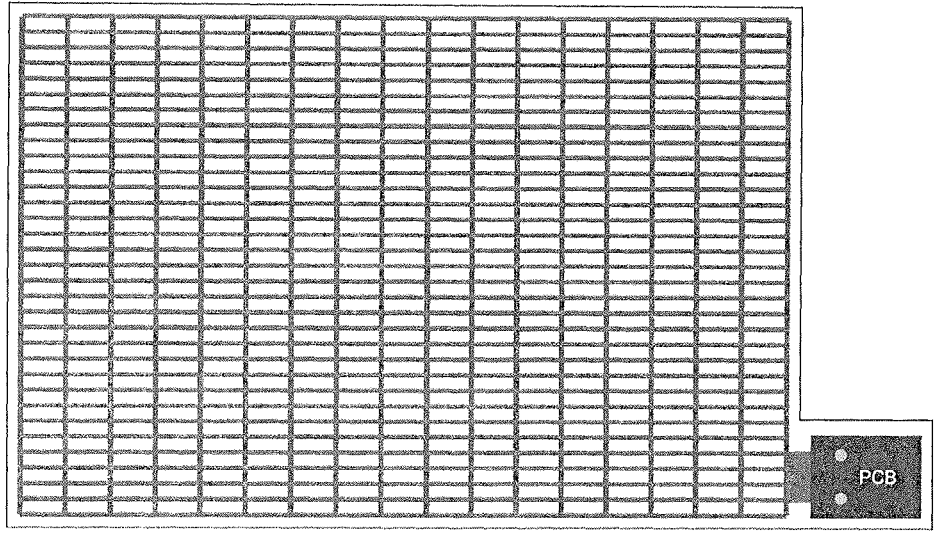
FIG. 1A is a schematic of the pattern of conducting material printed on a plate located towards the top of a monitoring sensor pad.
Figure 1B:
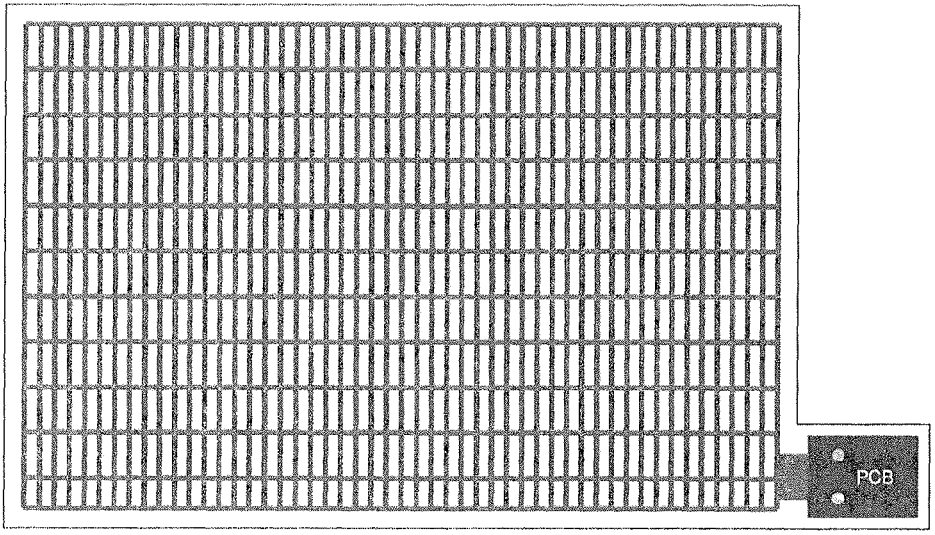
FIG. 1B is a schematic of the pattern of conducting material printed on a plate located towards the bottom of a monitoring sensor pad.

FIGS. 1A and 1B show the standard designs for conductive material on the top and bottom plates of sensor pads with a single zone, on each plate. The designs of the conductive material on the top and bottom plates form arrays of rectangles that are oriented such that the long axes of the rectangles on the top plate are perpendicular to the long axes of the rectangles on the bottom plate. A single fault indicating no resistance, such as a short circuit or reduced resistance, on this type of pad will result in a complete failure of this type of sensor pad. A short circuit can be caused by a permanent deformation in either one or both plates within the sensor pad, causing constant contact between the plates. Additionally, deformation of the conductive material, but not the plate, can also cause a fault, or short circuit, if the deformation causes the circuit to be continually in a closed state. The conductive material of the top plate can electrically contact the conductive material of the bottom plate in a constant manner via a conductive pathway, such as a piece of metal or other conductive material that simultaneously contacts both the top and bottom plates. Moisture between the plates, such as when a liquid is spilled or the sensor pad is otherwise soiled, can also cause a sensor pad with a single zone on each plate to fail.

The threshold resistance value detected by a standard patient monitoring pad to indicate the presence of a patient is normally relatively high, on the order of 10 k ohm (k$\Omega$) to 100 k$\Omega$. Accepting resistances in this range as indicating an occupied monitoring pad, such as one placed in a bed or chair beneath a patient, can help to minimize battery consumption in standard patient monitoring pads. However, early indication of the malfunctioning of a standard monitoring pad can become difficult when operating in this mode. The designs for modified sensor pads shown in FIGS. 1A and 1B can be combined with the ability to detect when the patient monitoring pad approaches a high resistance threshold for an unoccupied monitoring pad, as well as a low resistance threshold for an occupied monitoring pad. The high limit threshold for an unoccupied monitoring pad can be greater than around 100 k$\Omega$, and the low limit threshold for an occupied monitoring pad can be less than around 1 k$\Omega$.

The contact plates located towards the top and bottom of the sensor pad can be hard plastic boards with carbon/silver alloy lines printed on the surface of each plate. The lines can also be of a copper alloy, a nickel alloy, a chrome alloy, or any other suitably conductive material.

A monitoring system with a sensor pad having the plate designs shown in FIGS. 1A and 1B can have the ability to detect when the sensor pad is approaching the end of its useful life by monitoring the resistance between the top and bottom plate while a patient is situated atop the sensor pad and indicating to a care giver when the sensor pad has reached a threshold closed circuit resistance value. The threshold closed circuit resistance value will be selected to be a value that will not cause the system to falsely indicate to a caregiver that the patient has left his or her place on the sensor pad. When the resistance is excessively high while a patient is sitting or lying on the sensor pad, the monitoring circuit may not be able to distinguish when the patient has left the chair or bed that the monitoring pad occupies. Because the resistance between the top and bottom plate increases gradually with time, the monitoring system can track the progression in resistance, and when the resistance plateaus or is consistently above the threshold close circuit resistance value, the monitoring system can emit an alarm signal or message. The threshold close circuit resistance value can be a percentage of an initial resistance or an absolute value. The alarm signal can be an audio signal, a visual signal, or both an audio and visual signal. An audio signal can be a sustained sound, an instantaneous sound, and/or a repeating sound. A visual signal can be a flashing light, an indicator light, a message on a user interface, or any combination thereof. A message can be a message on a user interface, a message sent to an external device, or an audio message.

U.S. patent application Ser. No. 12/606,043 describes one type of sensor pad and is incorporated herein in its entirety. This type of sensor pad has one zone on each plate.

Figure 2A:
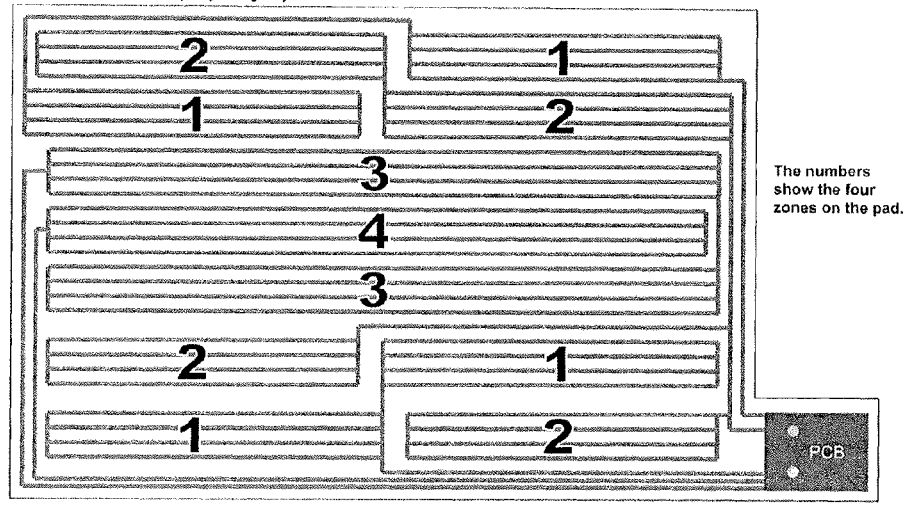
FIG. 2A is a schematic of the pattern of conducting material printed on a plate located towards the top of a monitoring sensor pad that has multiple contact zones.
Figure 2B:
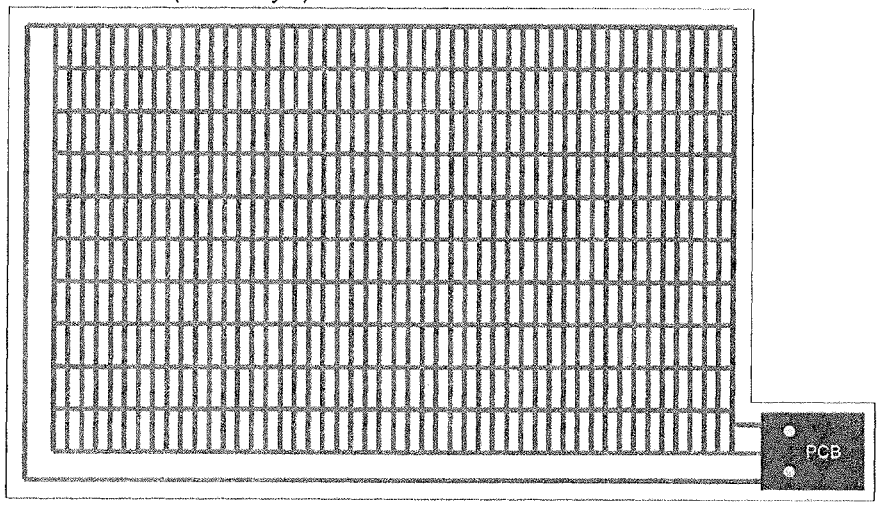
FIG. 2B is a schematic of the pattern of conducting material printed on a plate located towards the bottom of a monitoring sensor pad that has multiple contact zones.

FIGS. 2A and 2B show the designs for conductive material on the top and bottom plates of a sensor pad with multiple zones. FIG. 2A shows the patterning of the conductive material on the top plate of the sensor pad. The top plate has four zones, labeled 1, 2, 3, and 4. Zones 1 and 2 are along the outside edges of the plate. Just inside zones 1 and 2, but not quite in the middle, is zone 3. Zone 4 occupies the middle of the plate and is oriented along the long axes of the plate and sensor pad. The pattern of conductive material on the top plate has multiple pathways, or leads, to the printed circuit board (PCB) that leads to the rest of the patient monitoring system. The bottom plate, shown in FIG. 2B, has conductive material forming an array of rectangles, similar to the pattern on the bottom plate shown in FIG. 1B. However, the leads leading from the pattern of conductive material on the lower plate back to the printed circuit board are shown to be different in FIG. 2B, such that there is more than one.

In normal operation, all four zones of the top plate shown in FIG. 2A will make some degree of contact with the bottom plate of a sensor pad while a patient sits or lies on the pad. Nominally, at least two of the four zones will make some degree of physical and electrical contact with the bottom plate of a sensor pad while a patient sits or lies on the sensor pad. When the sensor pad is in a failure state, less than all four zones of the top plate are electrically separated from the bottom plate while a patient is off the sensor pad. That is to say, that in a failure state, at least one zone of the top plate is in electrical contact with the bottom plate for more than a predetermined time period while the other zones are in open circuit, or non-contact, states. The symmetrical design of the top plate of the sensor pad makes it difficult to trigger this failure state simply by sitting on only one portion of the sensor pad, such as when a patient is getting up out of bed. The predetermined time period can be a matter of minutes, such as 5 minutes or more. When the sensor pad is in the failure state for longer than the predetermined time period, an alarm or message can be emitted or sent by the patient monitoring system, as described above. Even though one zone may be in the failure state, the other zones will be able to detect the rising of a patient, and the patient monitoring system can still notify a caregiver of the patient's movement. A distinct warning or alarm can occur when a patient vacates the top of the sensor pad, and that warning or alarm can be different from the failure mode alarm.

Figure 3A:
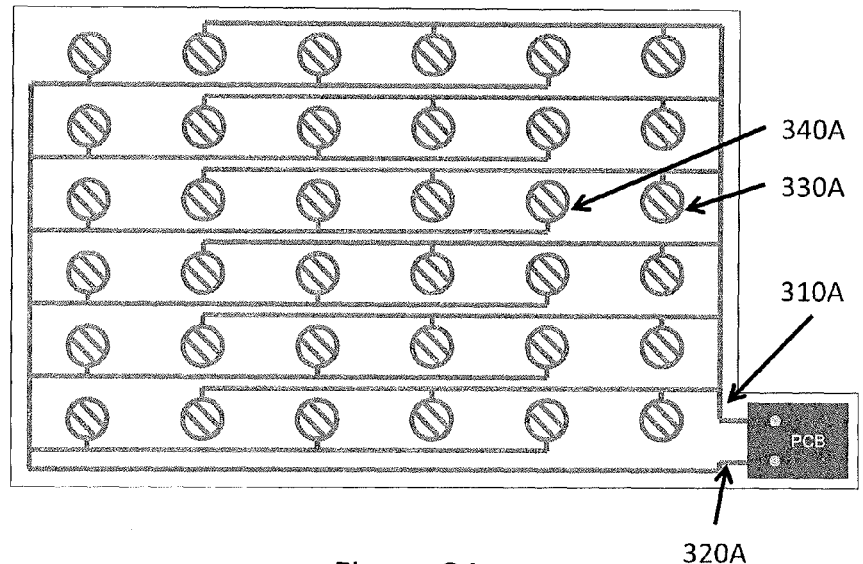
FIGS. 3A and 3B are schematics of other patterns of conducting material printed on a plate located towards the top of a monitoring sensor pad that has multiple contact zones.
Figure 3B:
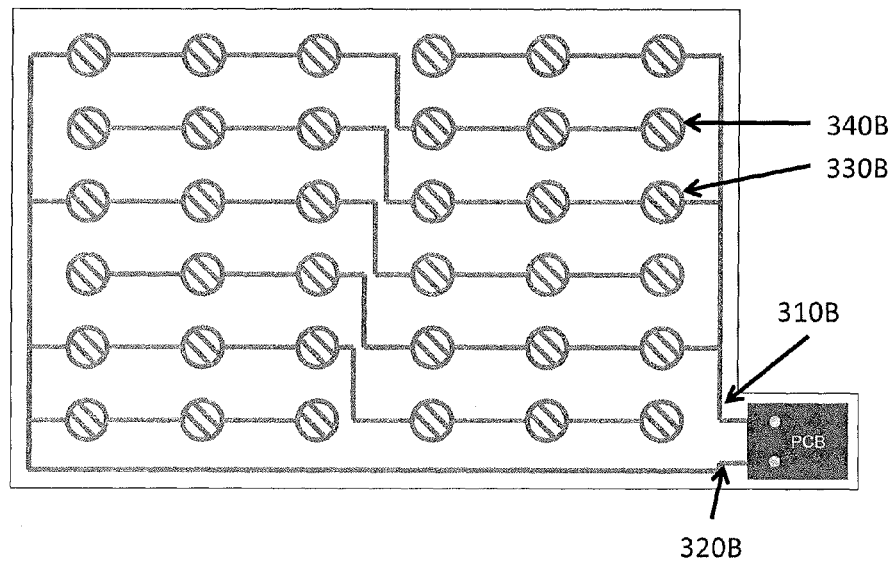

FIGS. 3A and 3B show other patterns of conducting material printed on a plate located towards the top of a monitoring sensor pad that has multiple contact zones. In these exemplary patterns, there are two zones which are connected to a printed circuit board (PCB) through distinct leads, 310A and 320A in FIG. 3A and 310B and 320B in FIG. 3B. Each lead connects to a series of evenly-spaced circular regions. For example, the leads 310A and 310B are connected to the regions 330A and 330B, which alternate with the regions 340A and 340B which are connected to the leads 320A and 320B, respectively. Such alternating areas of conducting material can allow the monitoring pad to continue to function even when a portion of the monitoring pad has deteriorated or is otherwise compromised. For example, in FIG. 3A, when the lead 310A is compromised or the conducting region 330A begins to function improperly, resistance information from a properly functioning lead 320A and/or conductive area 340A, that experiences similar pressure from a patient, can allow the monitoring pad to continue to detect the movements of the patient correctly.

Figure 3C:
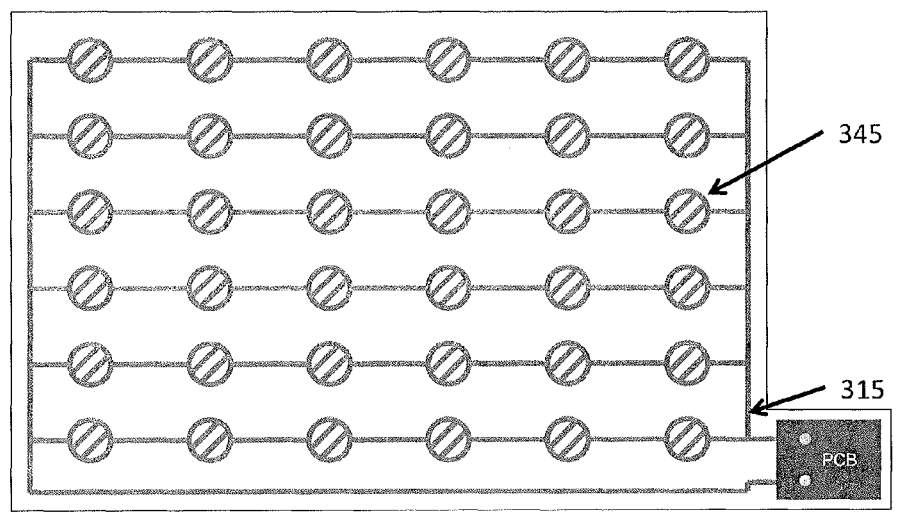
FIG. 3C is a schematic of an exemplary pattern of conducting material that could be printed on a plate located towards the bottom of a monitoring sensor pad that can use the pattern of either FIG. 3A or 3B.

FIG. 3C shows an exemplary pattern 315 of conducting material that could be printed on a plate located towards the bottom of a monitoring sensor pad that can use the pattern of either FIG. 3A or 3B on the top plate. The conducting material shown in FIG. 3C has a similar form to that shown in FIGS. 3A and 3B, in that there are connected, circular regions 345 of conductive material that are spaced at regular intervals to optimize resistance readings as a patient moves.

Figure 4:
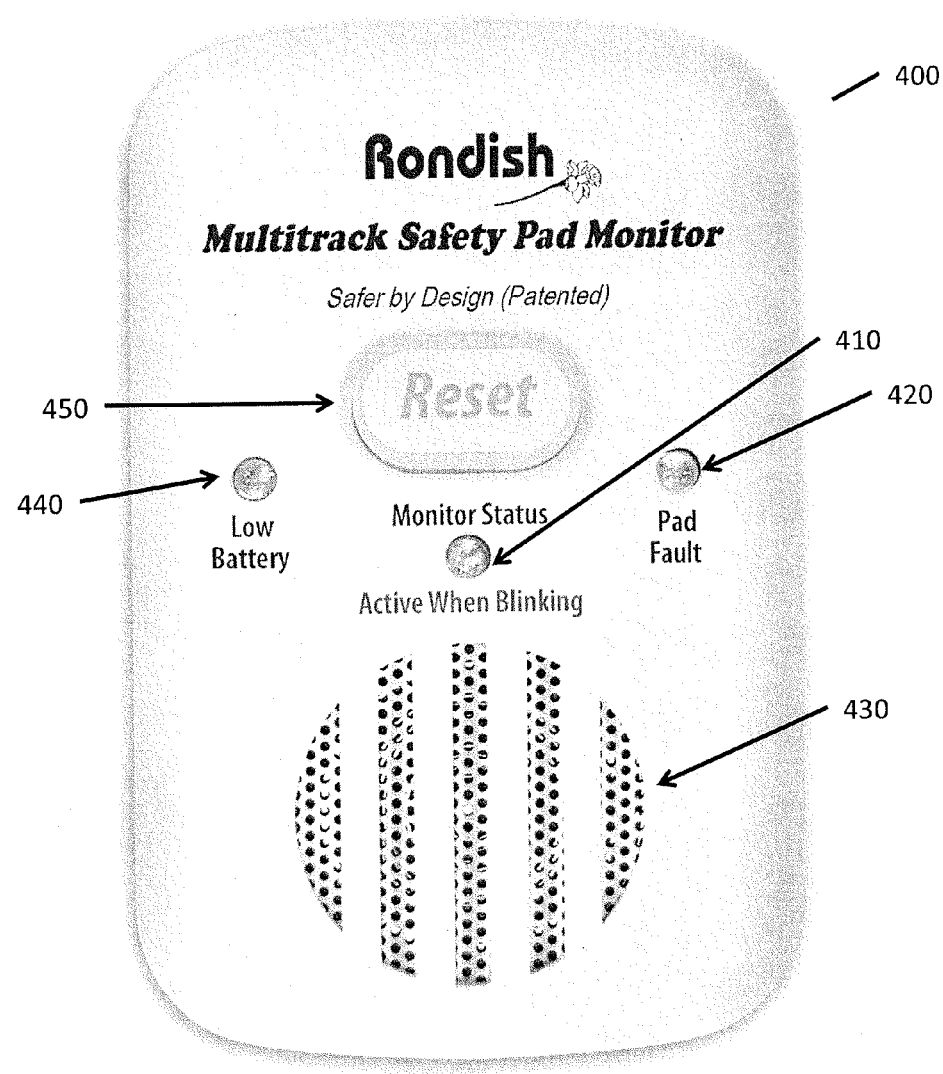
FIG. 4 is a schematic showing the features that can be present in an alarm indicator that can be associated with a monitoring sensor pad.

FIG. 4 shows the features that can be present in an alarm indicator 400 that can be associated with a patient monitoring system with a sensor pad. The alarm indicator 400 can have a monitor status light 410, a pad fault light 420, an alarm speaker 430, a low battery light 440, and a resent button 450. The monitor status light 410 blinks to show that the monitoring pad has power and is actively detecting the movements of a patient. The pad fault light 420 is dark when the monitoring pad is functioning normally. When the resistance measured across the plates of the monitoring pad varies from the expected values, the pad fault light 420 can light up. Other instances when the pad fault light 420 can light up include when an open circuit is detected, when there is excessive alternation between states, and the like. The low battery light 440 is dark when a battery powering the monitoring pad or the alarm indicator 400 is operating normally. When the battery is no longer providing the level of power, or electrical potential, that it should during normal operation, the low battery light 440 can light up. As mentioned elsewhere herein, the alarm can include auditory alarms, such as sounds or spoken messages. The alarm speaker 430 can be the point from which auditory alarms are emitted. In some systems, haptic alarms, such as vibrations, can also be emitted from the alarm indicator 400.

The monitoring system can monitor the resistance between the various zones of the top plate the bottom plate, in addition to open or closed status of the circuit in each zone. During normal operation, the resistance between any given zone in the top plate and the bottom plate will be at a low resistance level, for example, less than about 100 Ω (Ohm) when a patient is on the sensor pad. Also during normal operation, the resistance between any given zone in the top plate and the bottom plate will be at a high resistance level, such as greater than about 100 kΩ, when the senor pad is unoccupied. A sensor pad that is faulty or needs to be changed can have a resistance that is greater than the low resistance level when the sensor pad is occupied. Reasons that an occupied sensor pad has a resistance across the top and bottom plates of greater than the low resistance level can include worn contacts on the plates or faulty connections in the sensor pad. When the resistance between the top and bottom plates in an unoccupied sensor pad falls below the high resistance level, the sensor pad may be faulty and have a current leak, such as through dampness in the sensor pad or stray contacts reaching each other even when the sensor pad is not occupied.

It should be appreciated that the sensor pad is not limited to use with a bed or bed mattress. The sensor pad can be used in combination with any item that a patient lays on or sits in, including a bed, chair, couch, and the like. In this regards, the size and shape of the sensor pad can vary to suit the item with which it is used. Additionally, though much of the description is provided in terms of a sensor pad, a monitoring pad can also have the features and performance attributed to a sensor pad.

Moreover, although described in the context of use with a nursing station, it should be appreciated that the sensor pad can be used in any situation where monitoring of a patient or individual is desired. For example, the sensor pad can be communicatively coupled to a Personal Emergency Alarm System (PERS) for on-site assisted living accommodation, to a nurse's station or off-site alarm relay via the telephone network or internet, to alert family, friends, caregivers, control centers, or any combination thereof. The sensor pads can also be communicatively coupled with Nursecall Systems in hospitals, nursing homes, and other assisted living facilities. The sensor pad can be coupled to the rest of the patient monitor system via a wired or wireless connection. Wired connections can include telephone line connections, RS232 connections, USB connections, firewire connections, proprietary connections, or any other suitable type of hard-wired connection. Wireless connections between the sensor pad and the rest of the patient monitor system can utilize any suitable wireless system, such as Bluetooth, WiFi, radio frequency, Zigbee communication protocols, infrared, cellular phone systems, and the like, and can also employ coding or authentication to verify the origin of the information received by the patient monitor system.

While this specification contains many specifics, these should not be construed as limitations on the scope of an invention that is claimed or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Although embodiments of various methods and devices are described herein in detail with reference to certain versions, it should be appreciated that other versions, methods of use, embodiments, and combinations thereof are also possible. Therefore the spirit and scope of the appended claims should not be limited to the description of the embodiments contained herein.

What is claimed is:

1. A bed monitoring pad, comprising:
   a first flexible plate with conductive material;
   a second plate with conductive material; and
   a circuit between the first flexible plate and the second plate having a resistance between the first flexible plate and the second plate that indicates a useful life-time remaining for the bed monitoring pad and a risk of non-operation of the bed monitoring pad, wherein a value of less than 100 kΩ (kilohm) in the resistance in the circuit between the first flexible plate and the second plate when the bed monitoring pad is unoccupied indicates that the bed monitoring pad is faulty,
   wherein the first flexible plate comprises at least two zones of conductivity, each zone of conductivity configured to make some degree of physical and electrical contact with the second plate when a patient sits or lies on the bed monitoring pad.

2. A patient monitoring system, comprising:
   a bed monitoring pad, comprising:
   a first flexible plate with conductive material;
   a second plate with conductive material; and
   a circuit between the first flexible plate and the second plate having a resistance between the first flexible plate and the second plate that indicates a useful life-time remaining for the bed monitoring pad and a risk of non-operation of the bed monitoring pad, wherein a value of less than 100 kΩ (kilohm) in the resistance in the circuit between the first flexible plate and the second plate when the bed monitoring pad is unoccupied indicates that the bed monitoring pad is faulty,
   wherein the first flexible plate comprises at least two zones of conductivity, each zone of conductivity configured to make some degree of physical and electrical contact with the second plate when a patient sits or lies on the bed monitoring pad; and an alarm indicator.

3. A method of making a patient monitoring pad, comprising:
   fabricating a flexible plate with conductive material on a first surface of the flexible plate, the conductive material forming at least two patterns that are electrically connected to a first printed circuit board, the at least two patterns alternating in a manner configured to allow the patient monitoring pad to continue to function even when a portion of the patient monitoring pad has deteriorated;
   fabricating a second plate with conductive material on a first surface of the second plate, the conductive material forming a single pattern that is electrically connected to a second printed circuit board;
   placing the flexible plate opposite the second plate with the first surface of the flexible plate facing the first surface of the second plate with a compliant material between the flexible plate and the second plate; and
   creating an electrical circuit between the flexible plate and the second plate, the electrical circuit providing at least information about a resistance in the circuit between the flexible plate and the second plate when current flows through the circuit and is monitored,
   wherein each pattern of conductive material on the first surface of the flexible plate is configured to make some degree of physical and electrical contact with the conductive material on the second plate when a patient sits or lies on the patient monitoring pad,
   further wherein the resistance between the flexible plate and the second plate indicates a useful life-time remaining for the patient monitoring pad and a risk of non-operation of the patient monitoring pad, wherein a value of less than 100 kΩ (kilohm) in the resistance in the circuit between the flexible plate and the second plate when the patient monitoring pad is unoccupied indicates that the patient monitoring pad is faulty.

4. The method of claim 3, wherein the resistance in the circuit between the flexible plate and the second plate correlates to an amount of contact wear between the flexible plate and the second plate.

5. The method of claim 4, wherein the resistance between the flexible plate and the second plate indicates a useful life-time remaining for the patient monitoring pad.

6. The method of claim 3, wherein the resistance between the flexible plate and the second plate correlates to soiling or water ingress in that area of the patient monitoring pad.

7. The method of claim 6, wherein the resistance between the flexible plate and the second plate indicates a risk of non-operation of the patient monitoring pad.

* * * * *